United States Patent
Chuang et al.

(10) Patent No.: US 6,608,785 B2
(45) Date of Patent: Aug. 19, 2003

(54) METHOD AND APPARATUS TO ENSURE FUNCTIONALITY AND TIMING ROBUSTNESS IN SOI CIRCUITS

(75) Inventors: Ching-Te Kent Chuang, South Salem, NY (US); Jente Benedict Kuang, Lakeville, MN (US); Mary Joseph Saccamango, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/041,231

(22) Filed: Jan. 7, 2002

(65) Prior Publication Data

US 2003/0128606 A1 Jul. 10, 2003

(51) Int. Cl.[7] ................................. G11K 7/00
(52) U.S. Cl. ........................... 365/201; 361/56
(58) Field of Search ................ 365/201, 154; 361/56, 91.1, 111, 118

(56) References Cited

U.S. PATENT DOCUMENTS

| | | | | |
|---|---|---|---|---|
| 6,078,058 A | * | 6/2000 | Hsu et al. | ................... 257/48 |
| 6,151,200 A | * | 11/2000 | Hsu et al. | ................... 361/56 |
| 6,385,124 B2 | * | 5/2002 | Ooishi | ............... 365/30.06 |
| 6,392,855 B1 | * | 5/2002 | Kuang et al. | ............... 361/56 |

* cited by examiner

*Primary Examiner*—Son T. Dinh
(74) *Attorney, Agent, or Firm*—Joan Pennington

(57) ABSTRACT

Methods and apparatus are provided to ensure functionality and timing robustness in silicon-on-insulator (SOI) complementary metal oxide semiconductor (CMOS) circuits. A select signal for the SOI CMOS circuit is received. A floating body charge monitoring circuit is coupled to the SOI CMOS circuit for monitoring excess body charges in at least one predefined SOI device and providing an output control signal. A select signal adjusting circuit is coupled to the floating body charge monitoring circuit receiving the output control signal and the select signal and providing a conditionally adjusted select signal responsive to the output control signal of the floating body charge monitor circuit. The conditionally adjusted select signal is applied to the SOI CMOS circuit. The conditionally adjusted select signal provided by the select signal adjusting circuit responsive to the output control signal of the floating body charge monitor circuit includes a predefined delay at the trailing edge of the select signal extending the select signal pulse width. The conditionally adjusted select signal includes a shortened select signal pulse having a predefined delay at the rising edge of the select signal. The conditionally adjusted select signal includes a substantially unchanged select signal pulse width with a predefined delay of the rising edge of the select signal.

17 Claims, 10 Drawing Sheets

METHOD AND APPARATUS TO ENSURE FUNCTIONALITY AND TIMING ROBUSTNESS IN SOI CIRCUITS

FIELD OF THE INVENTION

The present invention relates to methods and apparatus to ensure functionality and timing robustness in silicon-on-insulator (SOI) complementary metal oxide semiconductor (CMOS) circuits.

DESCRIPTION OF THE RELATED ART

Silicon-on-insulator (SOI) technology is an enhanced silicon technology currently being utilized to increase the performance of digital logic circuits. By utilizing SOI technology, designers can increase the speed of digital logic integrated circuits or can reduce their overall power consumption. These advances in technology enable the development of more complex and faster integrated circuits that operate with less power.

An SOI transistor suffers from one inherent flaw. The floating body of the SOI transistor can develop a body charge over time. The amount of such floating body charge depends upon the potentials at the source, drain and gate of the SOI transistor. The maximum amount of charging occurs when the gate is completely turned off and both the source and drain electrodes are biased at the highest voltage supply Vdd. Given enough time, the body charge of the SOI transistor will eventually reach a saturation level. If a switching activity occurs for that device, a transient parasitic bipolar current can be induced in conjunction with the normal device drain current. The transient parasitic bipolar current causes the well known first cycle performance degradation. In multiplexer style SOI circuit topologies, such timing behavior variation is particularly troublesome.

A need exists for an improved and effective mechanism for to ensure functionality and timing robustness in silicon-on-insulator (SOI) complementary metal oxide semiconductor (CMOS) circuits.

SUMMARY OF THE INVENTION

Principal objects of the present invention are to provide methods and apparatus to ensure functionality and timing robustness in silicon-on-insulator (SOI) complementary metal oxide semiconductor (CMOS) circuits. Other important objects of the present invention are to provide such methods and apparatus to ensure functionality and timing robustness in silicon-on-insulator (SOI) complementary metal oxide semiconductor (CMOS) circuits substantially without negative effect and that overcome many of the disadvantages of prior art arrangements.

In brief, methods and apparatus are provided to ensure functionality and timing robustness in silicon-on-insulator (SOI) complementary metal oxide semiconductor (CMOS) circuits. A select signal for the SOI CMOS circuit is received. A floating body charge monitoring circuit is coupled to the SOI CMOS circuit for monitoring excess body charges in at least one predefined SOI device and providing an output control signal. A select signal adjusting circuit is coupled to the floating body charge monitoring circuit receiving the output control signal and the select signal and providing a conditionally adjusted select signal responsive to the output control signal of the floating body charge monitor circuit. The conditionally adjusted select signal is applied to the SOI CMOS circuit.

In accordance with features of the invention, the conditionally adjusted select signal provided by the select signal adjusting circuit responsive to the output control signal of the floating body charge monitor circuit includes a predefined delay at the trailing edge of the select signal extending the select signal pulse width. The conditionally adjusted select signal includes a shortened select signal pulse having a predefined delay at the rising edge of the select signal. The conditionally adjusted select signal includes a substantially unchanged select signal pulse width with a predefined delay of the rising edge of the select signal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and apparatus are provided to guarantee functionality and timing consistency in SOI circuits while attaining a performance advantage at the same time. The method and apparatus address the initial-cycle speed and functionality concerns due to the parasitic bipolar current in SOI circuits.

In static timing tools used for SOI technology designs, mandatory overhead is required for delay variation in addition to the normal overhead of setup, hold, slew, and jitter in a conventional bulk technology. Two kinds of timing uncertainties addressed include: (1) variation caused by body potential changes in frequent switching events, and (2) initial-cycle variation in a circuit waking up after long dormancy. The latter is much less frequent, but significantly constraining, because such initial-cycle variation unduly imposes the overhead for all switching events regardless of history. The method and apparatus of the preferred embodiment alleviate the issue of such initial-cycle variation.

A related U.S. patent application Ser. No. 09/638,254, filed Aug. 14, 2000 now U.S. Pat. No. 6,392,855 and assigned to the present assignee, by Jente Benedict Kuang and Mary Joseph Saccamango is entitled "FLOATING BODY CHARGE MONITOR CIRCUIT FOR PARTIALLY DEPLETED SOI CMOS TECHNOLOGY."

Figure 1A:
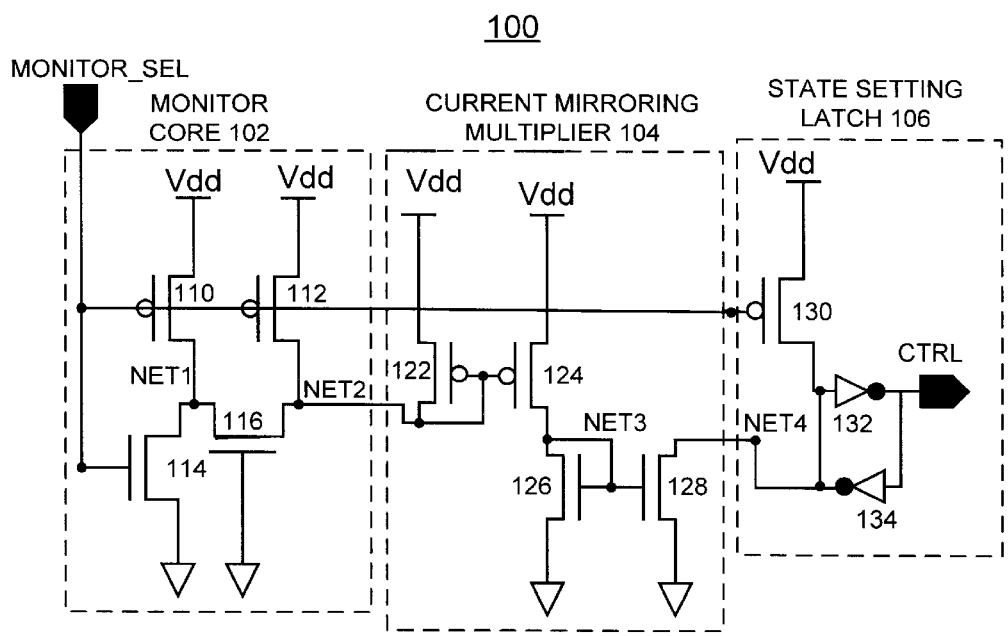
FIG. 1A is a schematic diagram representation illustrating a prior art floating body charge monitoring circuit in partially depleted silicon-on-insulator (SOI) CMOS circuits.

Having reference now to the drawings, in FIG. 1A, there is shown a prior art floating body charge monitoring circuit 100 for monitoring excess body charges in partially depleted silicon-on-insulator (SOI) CMOS circuits disclosed by the above identified United States patent application. Floating body charge monitoring circuit 100 includes a monitor core 102, a current mirroring multiplier 104 and a state setting latch 106. Floating body charge monitoring circuit 100 mimics the circuit configuration, device biasing, and history characteristics of the concerned circuit prone to the first cycle slowdown due to the existence of the parasitic bipolar current. When excess charges beyond tolerable limits are detected by the monitor core 102, an automatic discharge path is enabled to provide more switching current by the prior art floating body charge monitoring circuit 100. As a result, first cycle timing variation and speed degradation are effectively minimized.

The present invention significantly broadens the applicability of the previously disclosed floating body charge monitor discharge technique of the above-identified patent application. A node labeled CTRL of FIG. 1A is used for multiple control applications in accordance with the present invention.

Monitor core 102 is arranged for imitating an off state multiplexer topology with accompanying bias and select devices to conditionally generating an intentional bipolar discharge. Silicon-on-insulator (SOI) monitor core 102 includes a pair of SOI P-channel field effect transistors (PFETs) 110, 112 and a pair of SOI N-channel field effect transistors (NFETs) 114, 116. A monitor select (monitor_sel) input is applied to a respective gate of PFET 110, PFET 112 and NFET 114. NFET 116 is the monitor device. NFET 116 has its source connected to a node NET1, its drain connected to a node NET2 and its gate connected to ground. A body of SOI NFET 116 is charged at a potential that is representative of a body potential of a concerned SOI circuit.

A source of respective PFETs 110, 112 is connected to the high voltage supply Vdd. A drain of respective PFETs 110, 112 respectively is connected to node NET1 and node NET2. PFETs 110, 112 are precharge devices. NFET 114 has its drain connected to node NET1, and its source connected to ground. NFET 114 is a discharge trigger device. When the charge monitor core 102 is not selected when monitor select is low, the source and drain of NFET 116 at nodes NET1 and NET2 are precharged to the high voltage supply Vdd. When the charge monitor core 102 is selected when monitor select is high, the source of NFET 116 at node NET1 is brought to ground creating a bipolar current component which is input to the current mirroring multiplier 104.

Current mirroring multiplier 104 is an arrangement of a current amplifier that is conditionally or selectively turned on. Current mirroring multiplier 104 includes two current mirror stages defined by a pair of P-channel field effect transistors (PFETs) 122, 124 and a pair of N-channel field effect transistors (NFETs) 126, 128. A source of respective PFETs 122, 124 is connected to the high voltage supply Vdd. A drain and gate of PFET 122 is connected to node NET2 and to a gate of PFET 124. A drain of PFET 124 is connected to a node NET3 and a gate and drain of NFET 126. A source of respective NFETs 126, 128 is connected to ground. A drain of NFET 128 is connected to the state setting latch 106 at a node NET4. Current mirroring multiplier 104 is off with node NET2 bias at Vdd when not being triggered.

State setting latch 106 is arranged for determining and setting the condition for discharge actions, which is selectively turned on depending directly on the output current of current mirroring multiplier 104, which in turn depends on the severity of body potential bias or the amount of accumulated body charges of the monitor NFET 116. State setting latch 106 includes a latch state set device, PFET 130 and a pair of series connected inverters, forward inverter 132 and feedback inverter 134. A source of PFET 130 is connected to the high voltage supply Vdd. A drain of PFET 130 is connected to the input of inverter 132 at node NET4. A gate of PFET 130 is connected to the monitor select input. The output of inverter 134 is connected to node NET4. A common connection of the series connect inverters 132, 134 output of state setting latch 106 is labeled CTRL.

In accordance with features of the invention, the output signal CTRL of the state setting latch 106 is used to selectively implement a select signal to address the initial-cycle speed and functionality concerns due to the parasitic bipolar current in SOI circuits. The present invention provides multiple new features. Firstly, extension of the trailing edge of the select signal is conditionally triggered by output signal CTRL of the floating body charge monitor circuit. Secondly, shortening of the select signal, that is delayed start of the rising edge of the select signal pulse, is conditionally triggered by the floating body charge monitor circuit. Thirdly, parallel shifting of both rising and trailing edge of the select signal, is conditionally triggered by the floating body charge monitor circuit.

Each of these features of the present invention can be employed independently, in combination, and in conjunction with the disclosed discharge technique of the above-identified patent application. These features of the present invention provide the much desired history-dependent flexibility for the control signal which removes much of the overhead of timing paddings in the design margin consideration; enhances circuit robustness; and consequently, improves the overall performance and can be directly applied to diverse circuit styles and topologies.

Current mirroring multiplier 104 effectively translates a small intentional bipolar discharge current to a conditional flip of state in the discharge control latch 106 and enables tight control of design parameters for the charge monitor circuit 100. Without the current mirroring multiplier 104, the available parasitic bipolar current is often too small to trigger a reliable state change for the state setting discharge control latch 106. Current mirroring multiplier 104 includes current gain factors, wp124/wp122, channel width ratio of PFETs 124, 122 and wn128/wn126, channel width ratio of NFETs 128, 126 enabling effective control of the switching threshold. When the charge monitor 102 is not triggered, the current mirroring multiplier 104 does not consume power because the gate to source bias for PFET 122 is zero. In turn, PFET 124, NFET 126 and NFET 128 are all in their off state. Due to the use of the current mirroring multiplier 104, the entire design of charge monitor circuit 100 can be very small in layout area, with small devices implementing the monitor device NFET 116, the precharge PFETs 110, 112 and the discharge trigger NFET 114, without suffering timing loss, compromising signal quality, or sacrificing latch stability. With the current mirroring multiplier 104 and the path shut-off through PFET 130, the amplified NFET 128 drain current comes ahead of the originating bipolar current. In turn, this results in the timing advantage of a sharper discharge transition pulse edge.

Figure 1B:
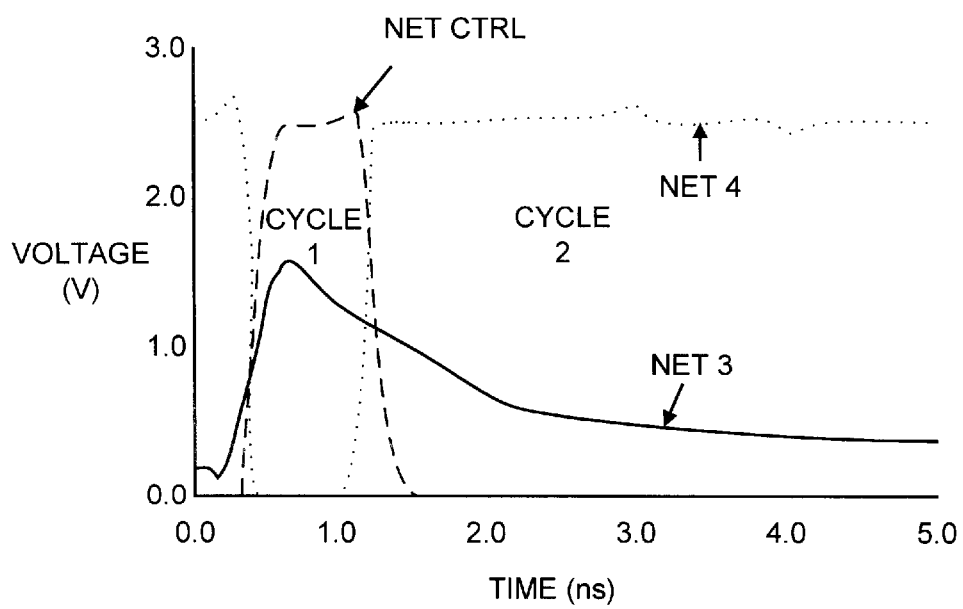
FIG. 1B a chart illustrating voltage waveforms during the first two access cycles for a current mirror and latch circuit of the prior art floating body charge monitoring circuit of FIG. 1A.

FIG. 1B is a chart illustrating voltage waveforms during the first two access cycles for the current mirror 104 and latch circuit 106 of the floating body charge monitoring circuit 100. In FIG. 1B voltage waveforms at nodes NET3, NET4 and CTRL are shown along the vertical axis relative to time shown along the horizontal axis. Note that a clean latch output pulse at node CTRL is generated as a result of transient currents at nodes NET3, NET4 in the first access cycle. During the second cycle, the monitoring circuit 100 does not produce a discharge output because the residual charges in the charge monitor 102 fall below the designated threshold.

Figure 1C:
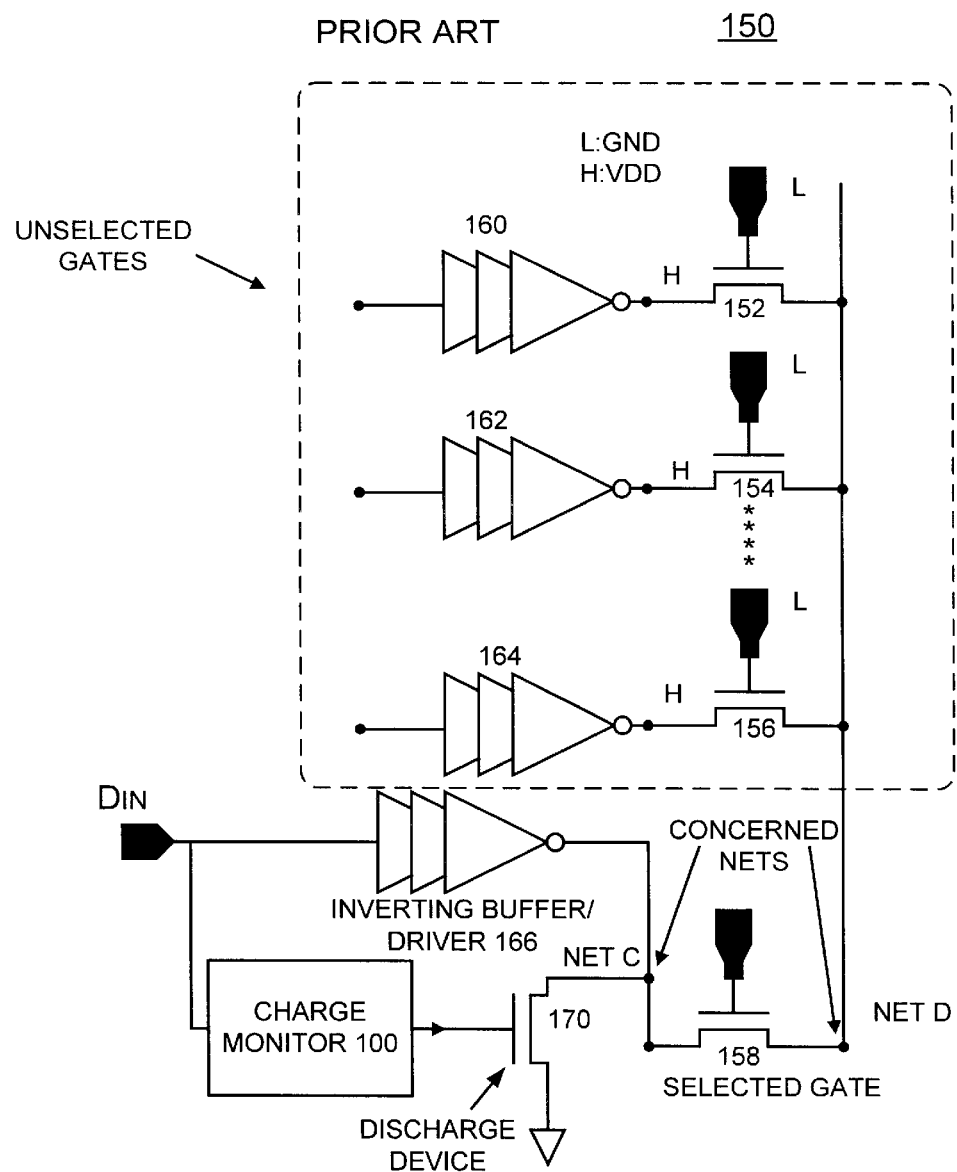
FIG. 1C is a schematic diagram representation illustrating an example multiplexer (MUX) circuit where the prior art floating body charge monitoring circuit of FIG. 1A is used to trigger an additional discharge path during the initial cycle operation.

FIG. 1C illustrates an example multiplexer (MUX) circuit 150 where the floating body charge monitoring circuit 100 is used. MUX circuit 150 includes a stack of a plurality of SOI NFETs 152, 154, 156, 158 each having a drain connected to a node net D. A source of the respective SOI NFETs 152, 154, 156, 158 is connected to a respective inverting buffer/driver 160, 162, 164, 166. Each inverting buffer/driver 160, 162, 164, 166 includes a selected odd number of inverters, such as one, three, or five inverters. A source of a discharge NFET 170 is connected to the source of SOI NFET 158 at a node NET C. The drain of discharge NFET 170 is connected to ground. The gate of discharge NFET 170 is connected to the output of the charge monitor 100. An input data signal (Din) is used to trigger the monitor select input for the charge monitor 100. SOI NFETs 152, 154, 156 are unselected gates and SOI NFET 158 is the selected gate. Discharge device NFET 170 connects the charge monitor 100 to node NET C to control discharge, as shown. Alternatively, discharge device NFET 170 can connect the charge monitor 100 to node NET D to control discharge. There are timing difference and layout implication with respect to the choice between NET C and NET D. However, this choice does not change the merit or configuration of the charge monitoring circuit 100.

Figure 2A:
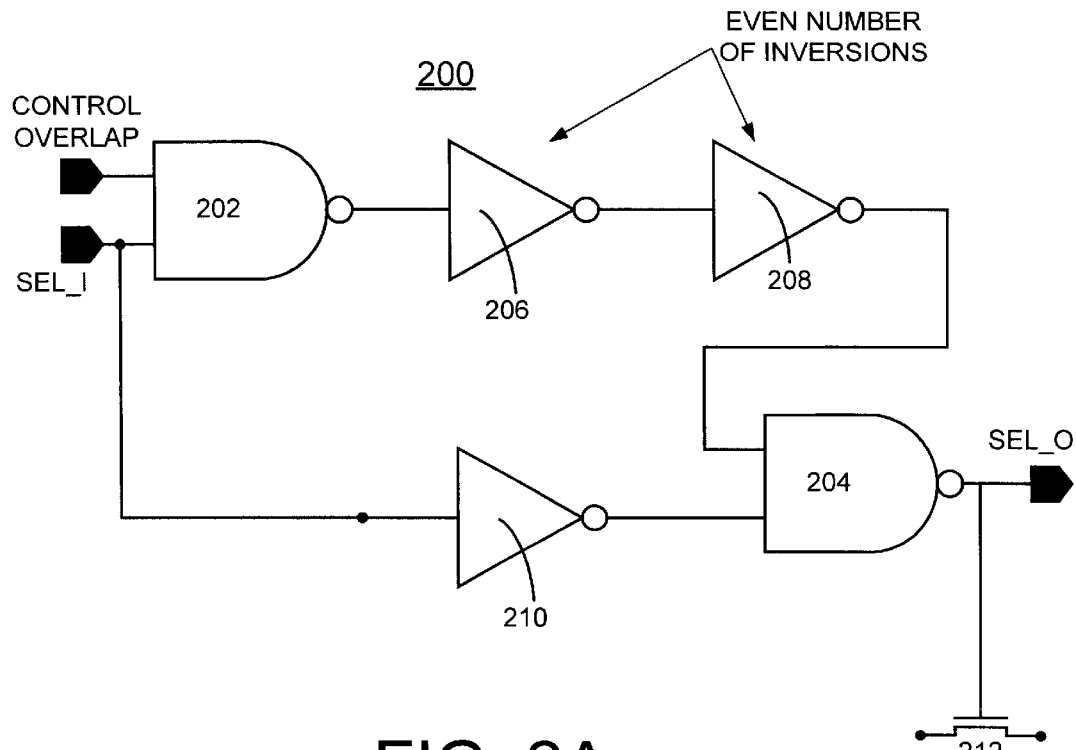
FIG. 2A is a schematic diagram illustrating an overlap adjusting circuit of a select signal in accordance with the preferred embodiment.

Referring now to FIG. 2A, there is shown an exemplary overlap adjusting circuit of a select signal in accordance with the preferred embodiment generally designated by the reference character 200. Often circuit timing in SOI circuits allows some extension of a select signal pulse width applied to the gate of a circuit stage without running into the risk of logic failure or performance degradation. In accordance with features of the invention, a one time exception or initial exception is implemented to permit the delayed cutoff of such a select signal in SOI designs. This way, the overall performance is not compromised by otherwise hard-coding into a particular design a longer select signal or slower response times in subsequent stages while satisfactorily addressing the initial-cycle concerns in SOI. This technique is very performance beneficial because it removes the pessimistic padding of timing margin often needed in the SOI design due to the lack of operating history smart circuit components.

FIG. 2A shows exemplary overlap adjusting circuit 200 for extension of the trailing edge of the select signal conditionally triggered by output signal CTRL of the floating body charge monitor circuit 100. The select signal is applied to a first input labeled SEL_I of the overlap adjusting circuit 200. The output signal CTRL from the floating body charge monitor circuit 100 is applied to a second input labeled CONTROL OVERLAP of the overlap adjusting circuit 200. Overlap adjusting circuit 200 includes a pair of NAND gates 202, 204 and a plurality of inverters 206, 208, 210 and provides a conditionally adjusted select signal output SEL_O to a gate of a field effect transistor (FET) 212.

As shown in FIG. 2A, the two-input NAND gate 202 receiving the select signal SEL_I and the control signal CONTROL OVERLAP is connected to a first one of a plurality of series connected inverter stages 206 and 208. An even number of inversions is provided by a selected number of the series connected inverter stages 206 and 208. The select signal SEL_I is applied to inverter 210. The outputs of the series connected inverter stages 206 and 208 and inverter 210 are applied to the two-input NAND gate 204. NAND gate 204 provides the conditionally adjusted select signal output SEL_O. Select signal output SEL_O provides an extension of the trailing edge of the select signal SEL_I when triggered by output signal CTRL of the floating body charge monitor circuit 100.

Figure 2B:
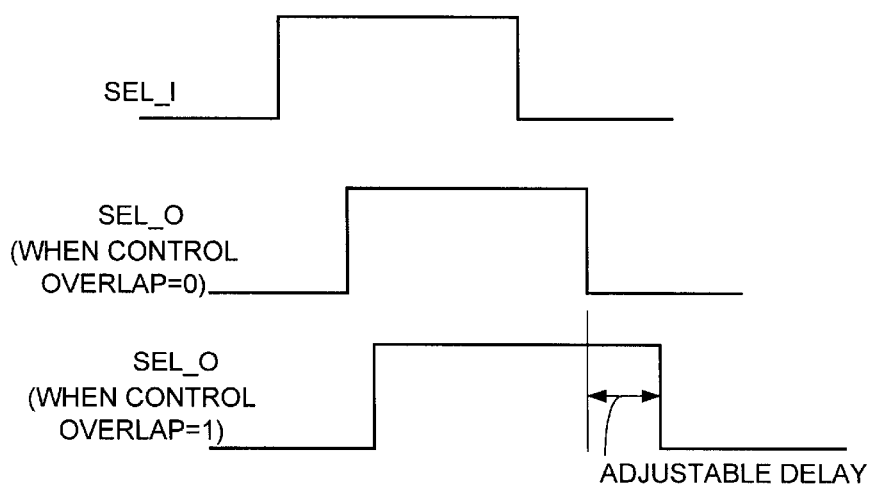
FIG. 2B is a timing diagram for the overlap adjusting circuit of a select signal of FIG. 2A in accordance with the preferred embodiment.

FIG. 2B is a timing diagram illustrating the operation of the overlap adjusting circuit 200 of FIG. 2A in accordance with the preferred embodiment. FIG. 2B shows an exemplary relative timing arrangement of the select signal SEL_I and the select signal output SEL_O when control signal CONTROL OVERLAP is zero and one. The extent of pulse extension labeled ADJUSTABLE DELAY in FIG. 2B can be adjusted by a predefined, selected number and propagation delay time of the inverter stages of the exemplary overlap adjusting circuit 200.

Figure 3A:
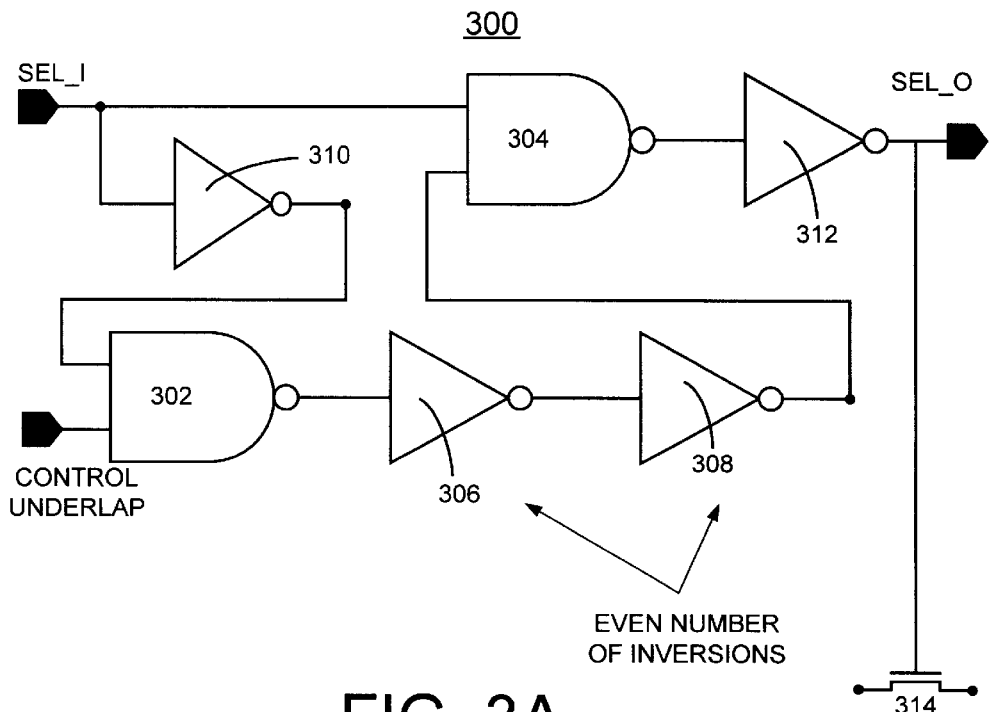
FIG. 3A is a schematic diagram illustrating an underlap adjusting circuit of a select signal in accordance with the preferred embodiment.

Referring now to FIG. 3A, there is shown an exemplary underlap adjusting circuit of a select signal in accordance with the preferred embodiment generally designated by the reference character 300 for shortening of the select signal for delayed start. Delayed completion of a logic evaluation during the initial-cycle circuit operation in SOI can require a delayed start of the next circuit stage and its logic function. Delayed start for the next circuit stage can ensure that correct data is fed to the input of that stage. This is particularly important for the SOI designs requiring both initial-cycle and short-path (early-mode) considerations. When the next logic function can be completed under the constraint of a reduced pulse width, a one time exception can be granted by enabling the underlap function provided by underlap adjusting circuit 300 which shortens the select pulse width by delaying the rising edge of the select signal output SEL_O.

FIG. 3A shows exemplary underlap adjusting circuit 300 for delaying of the rising edge of the select signal conditionally triggered by output signal CTRL of the floating body charge monitor circuit 100. The select signal is applied to a first input labeled SEL_I of the underlap adjusting circuit 300. The output signal CTRL from the floating body charge monitor circuit 100 is applied to a second input labeled CONTROL UNDERLAP of the underlap adjusting circuit 300. Underlap adjusting circuit 300 includes a pair of two-input NAND gates 302, 304 and a plurality of inverters 306, 308, 310, 312 and provides a conditionally adjusted delayed start select signal output SEL_O to a gate of a field effect transistor (FET) 314.

As shown in FIG. 3A, the two-input NAND gate 302 receiving the inverted select signal SEL_I and the control signal CONTROL UNDERLAP is connected to a first one of a plurality of series connected inverter stages 306 and 308. An even number of inversions is provided by a selected number of the series connected inverter stages 306 and 308. The select signal SEL_I is applied to inverter 310. The outputs of the series connected inverter stages 306 and 308 and select signal SEL_I are applied to the two-input NAND gate 304. The output of NAND gate 304 is applied to an inverter stage 312 that provides the conditionally adjusted delayed start select signal output SEL_O. Select signal output SEL_O provides a shortened select signal with a delayed start rising edge of the select signal when triggered by output signal CTRL of the floating body charge monitor circuit 100.

Figure 3B:
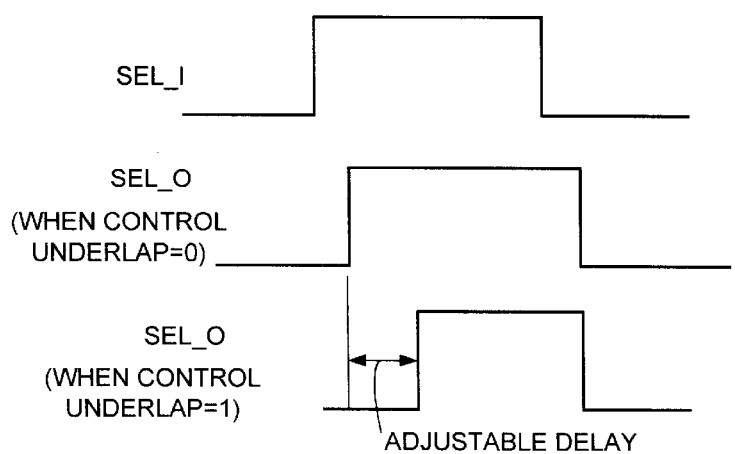
FIG. 3B is a timing diagram for the underlap adjusting circuit of a select signal of FIG. 3A in accordance with the preferred embodiment.

FIG. 3B is a timing diagram illustrating the operation of the underlap adjusting circuit 300 of FIG. 3A in accordance with the preferred embodiment. FIG. 3B shows an exemplary relative timing arrangement of the select signal SEL_I and the select signal output SEL_O when control signal CONTROL UNDERLAP is zero and one. The extent of delaying the select signal pulse rising edge labeled ADJUSTABLE DELAY in FIG. 3B can be adjusted by a predefined, selected number and propagation delay time of the inverter stages of the exemplary underlap adjusting circuit 300.

Figure 4A:
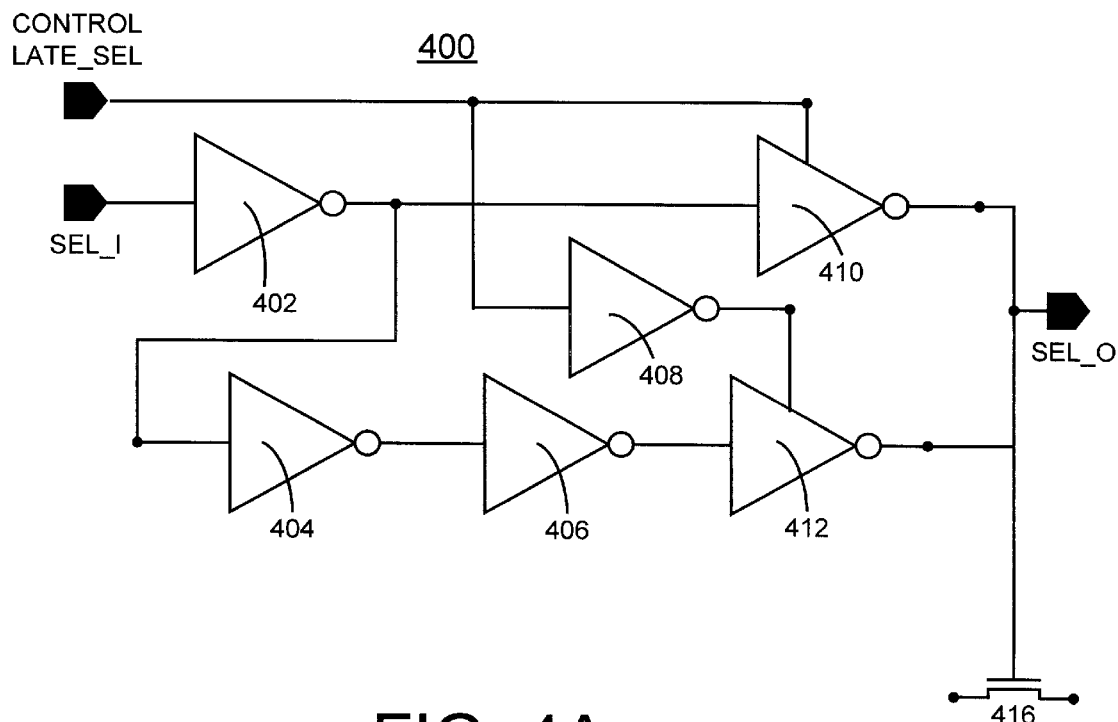
FIG. 4A is a schematic diagram illustrating a late select circuit of a select signal in accordance with the preferred embodiment.
Figure 4B:
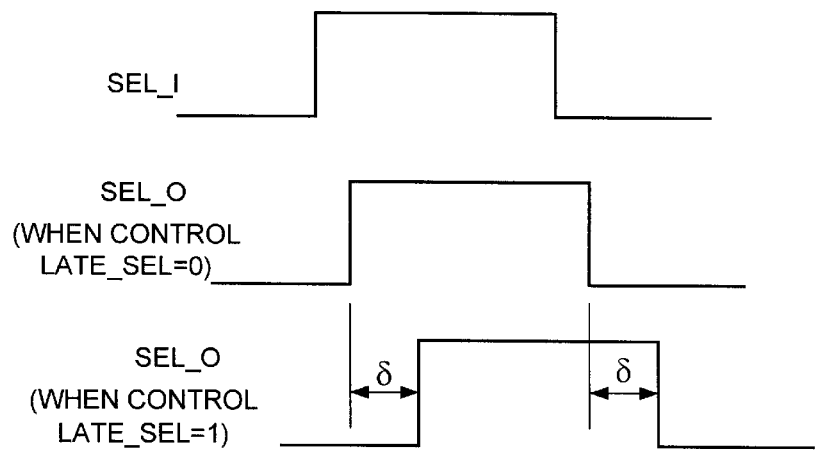
FIG. 4B is a timing diagram for the late select circuit of a select signal of FIG. 4A in accordance with the preferred embodiment.

Referring to FIG. 4A, there is shown an exemplary late select circuit 400 for delaying of the rising edge of the select signal without substantially changing the select signal pulse width conditionally triggered by output signal CTRL of the floating body charge monitor circuit 100. The provision of the previous technique of delayed start may not always be sufficiently long for the logic evaluation to complete at the next stage. In this case, the late select circuit 400 provides the option of a substantially parallel shift of both the rising and trailing edge of the select signal. As shown in FIG. 4B, substantially the same pulse width is given to the select signal with a delayed start such that the completion of logic evaluation at that stage is not prevented by a shortened pulse width.

The select signal is applied to a first input labeled SEL_I of the late select circuit 400. The output signal CTRL from the floating body charge monitor circuit 100 is applied to a second input labeled CONTROL LATE_SEL of the late select circuit 400. Late select circuit 400 includes a plurality of inverters 402, 404, 406, 408 and a pair of tri-state inverters 410, 412 provides a conditionally adjusted late start select signal output SEL_O to a gate of a field effect transistor (FET) 416.

As shown in FIG. 4A, the select signal SEL_I is applied to a first one of a plurality of series connected inverter stages 402, 404, 406 and the control signal CONTROL LATE_SEL is applied to an inverter 408 and a tristate control input of tri-state inverter 410. The output of inverter stage 402 is applied to the input of tri-state inverter 410. The output of the series connected inverter stages 402, 404, 406 is applied to the input of tri-state inverter 412. The output of inverter stage 408 is applied to a tri-state control input of tri-state inverter 412. The tri-state control polarity is set such that a one input renders a high-impedance state and a zero input renders regular inversion. The outputs of the tri-state inverters 410 and 412 are connected together to provide the conditionally adjusted late start select signal output SEL_O. Select signal output SEL_O provides a substantially unchanged select signal pulse width with a delayed start rising edge of the select signal when triggered by output signal CTRL of the floating body charge monitor circuit 100.

FIG. 4B is a timing diagram illustrating the operation of the late select circuit 400 of FIG. 4A in accordance with the preferred embodiment. FIG. 4B shows an exemplary relative timing arrangement of the select signal SEL_I and the select signal output SEL_O when control signal CONTROL LATE_SEL is zero and one. The extent of delaying the select signal pulse rising edge labeled δ in FIG. 4B can be adjusted by a predefined, selected number and propagation delay time of the inverter stages of the exemplary late select circuit 400.

Figure 5A:
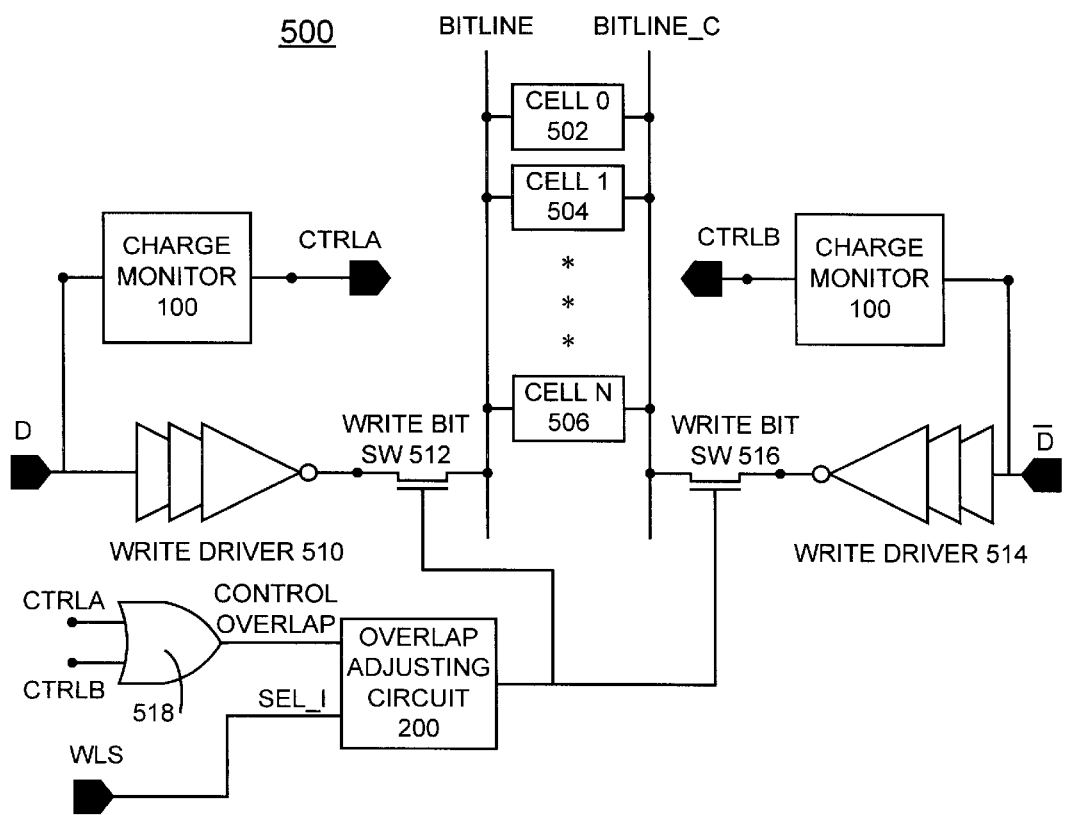
FIG. 5A is a schematic diagram illustrating an application example of the overlap adjusting circuit of a select signal of FIG. 2A in a silicon-on-insulator (SOI) static random access memory (SRAM) in accordance with the preferred embodiment.

Referring now to FIG. 5A, there is shown an application example of the overlap adjusting circuit 200 in a silicon-on-insulator (SOI) static random access memory (SRAM) in accordance with the preferred embodiment generally designated by the reference character 500. SOI SRAM 500 includes a plurality of SRAM storage cells 0-N, 502, 504, 506 connected between true and complement bitlines labeled BITLINE and BITLINE_C. A write true input D is applied to the true bitline, BITLINE by a write driver 510 coupled by a write bit switch, field effect transistor (FET) 512. A write complement input D-bar is applied to the complement bitline BITLINE_C by a write driver 514 coupled by a write bit switch, field effect transistor (FET) 516. A charge monitor circuit 100 is connected to the write driver 510 at the write true input D providing an output control signal labeled CTRLA. A charge monitor circuit 100 is connected to the write driver 514 at the write complement input D-bar providing an output control signal labeled CTRLB. The two charge monitor output control signals CTRLA and CTRLB are applied to a two-input NOR gate 518. The control signal CONTROL OVERLAP is supplied by the OR function of the two charge monitor output control signals CTRLA and CTRLB. The control signal CONTROL OVERLAP is applied to a first input of an overlap adjusting circuit 200. The wordline select (WLS) signal is applied to a second input SEL_I of an overlap adjusting circuit 200. The output of the overlap adjusting circuit 200 is applied to the gates of the write bit switches or FETs 512 and 516.

As the initial cycle write operation can be significantly slower due to aggregate parasitic bipolar current when the cells on a bitline have a highly polarized data pattern, a conditional delayed turnoff of the write bit switches 512 and 516 and/or local wordline can prevent functional failure.

Figure 5B:
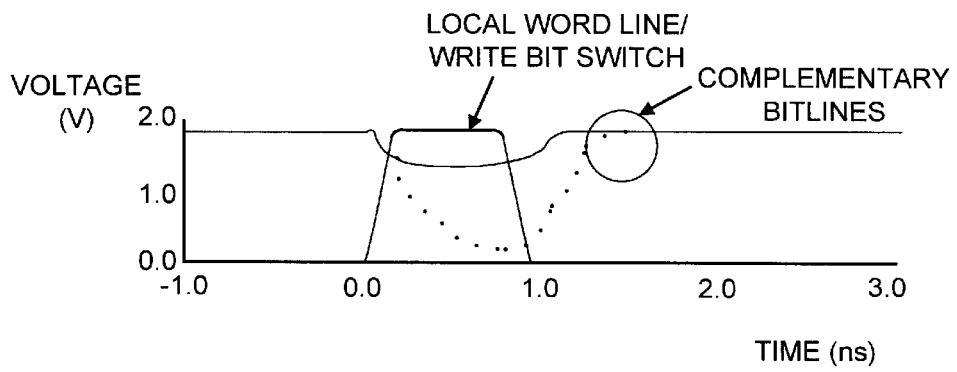
FIGS. 5B and 5C are timing diagrams for the SOI SRAM of FIG. 5A with the overlap adjusting circuit extending the write bit switch select signal triggered by the floating body charge monitoring circuit in accordance with the preferred embodiment.
Figure 5C:
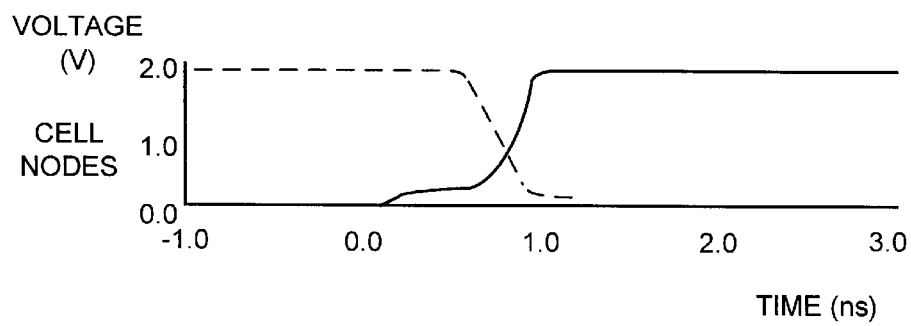

Referring to FIGS. 5B and 5C, there are shown timing diagrams for the SOI SRAM of FIG. 5A with the overlap adjusting circuit 200 extending the write bit switch select signal triggered by the floating body charge monitoring circuit 100 in accordance with the preferred embodiment. As can be clearly seen, the delayed turnoff ensures functionally correctness during the first cycle operation after long dormancy. In all subsequent cycles, the select pulse width returns to normal when the floating body charge monitor circuit 100 is not triggered and the signal CONTROL OVERLAP is equal to zero.

Figure 5D:
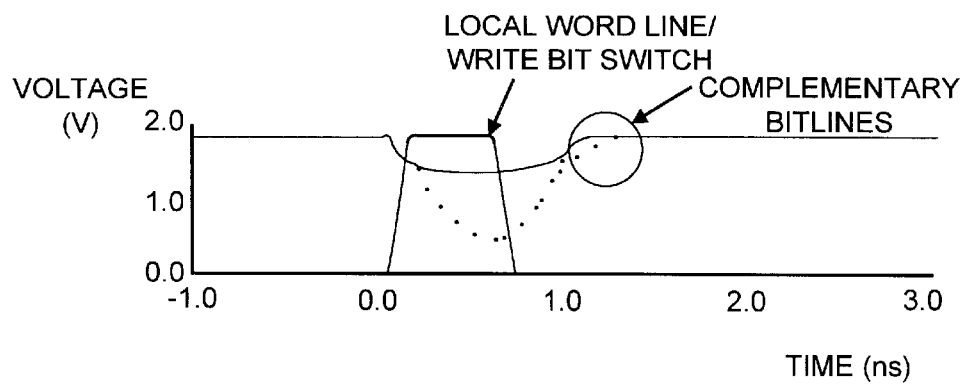
FIGS. 5D and 5E are timing diagrams for the SOI SRAM of FIG. 5A without any modification of the write bit switch select signal.
Figure 5E:
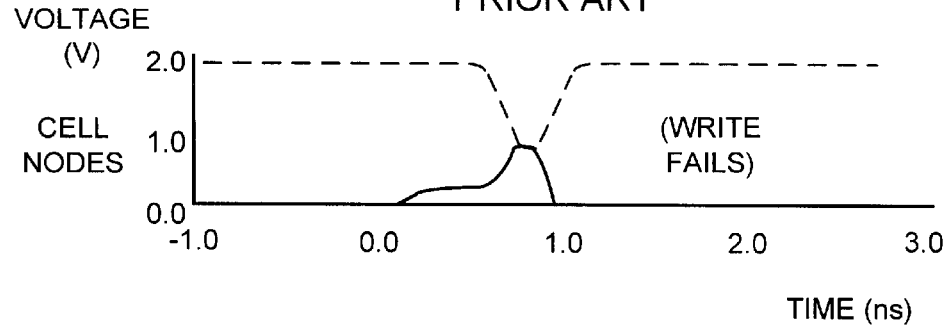

Referring to FIGS. 5D and 5E, there are shown timing diagrams for the SOI SRAM of FIG. 5A without any modification of the write bit switch select signal, enabling comparison of the voltage waveforms on bit lines and internal cell nodes for the circuit with and without employment of the select signal extension technique using the floating body charge monitor circuit 100. As shown in FIG. 5E, the write fails without employment of the select signal extension technique using the floating body charge monitor circuit 100.

It should be understood that the delayed turnoff technique can be used in conjunction with a stronger initial-cycle bit line discharge for further improvement. The same floating body charge monitor circuit 100, as needed by the select extension and additional discharge technique, respectively, can trigger both overlap adjusting circuit 200 of FIG. 2A and discharge device 170 of FIG. 1C. Also depending on actual circuit timing, bit line restoration immediately after a write may need the assistance of the delayed start technique of underlap adjusting circuit 300 of FIG. 3A.

Figure 6:
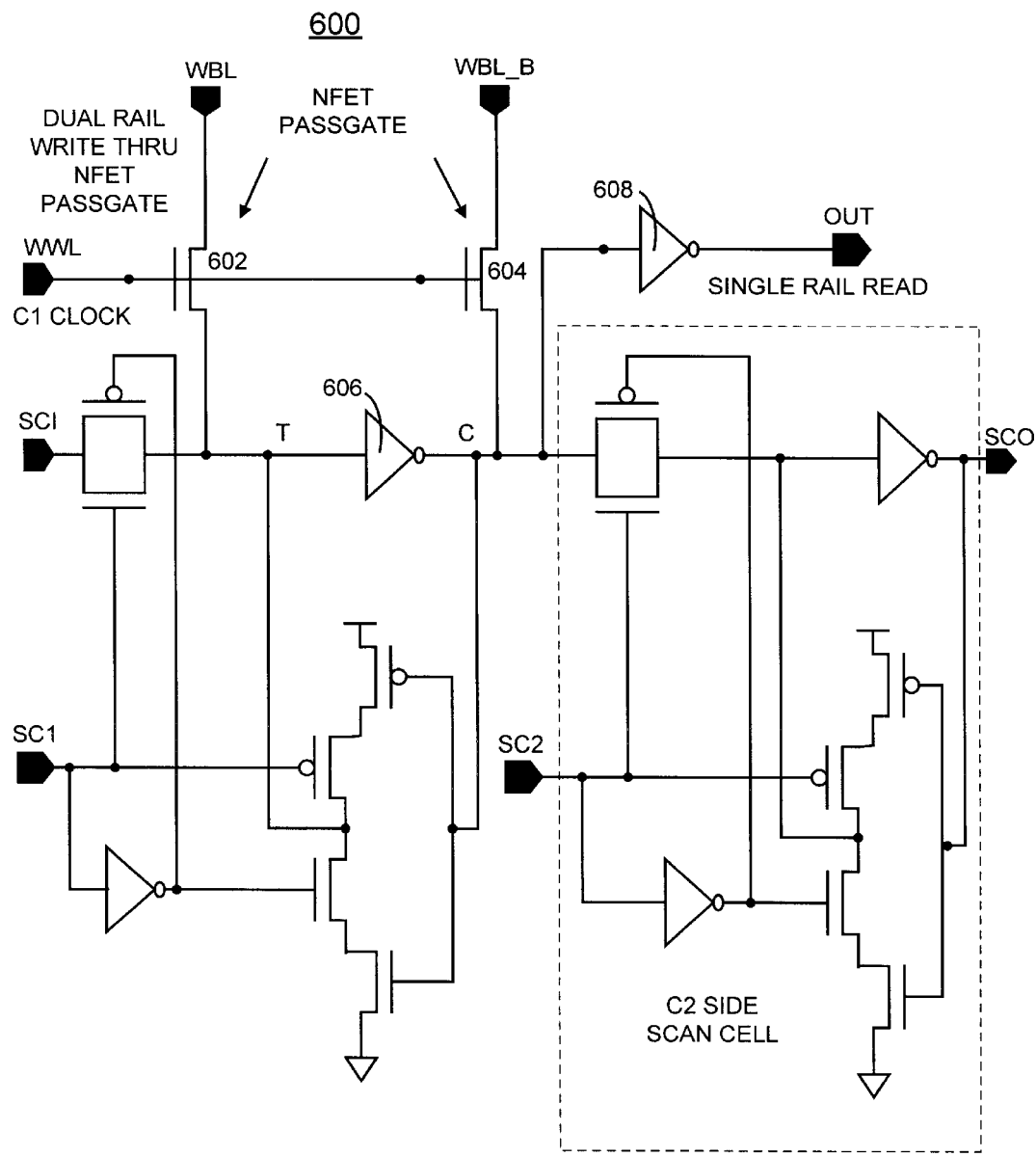
FIG. 6 is a schematic diagram illustrating an application example of the overlap adjusting circuit of a select signal of FIG. 2A in a silicon-on-insulator (SOI) register file write operations in accordance with the preferred embodiment.

FIG. 6 illustrates an application example of the overlap adjusting circuit of a select signal of FIG. 2A in a silicon-on-insulator (SOI) register file in accordance with the preferred embodiment for a register cell designated by the reference character 600. Register cell 600 includes dual rail write thru N-channel field effect transistor (NFET) passgates 602, 604 connected on true and complement nodes labeled T, C of a first inverter 606 connected in series with a second inverter 608. A single rail read output is provided by the inverter 608. Register cell 600 includes scan control logic receiving a scan control input SCI and providing a scan control output SCO, as shown in FIG. 6 that is used for testing and is isolated from node T during normal operation of the register cell 600. Register cell 600 shown in FIG. 6 is a general purpose, static register cell version. However, it should be understood that the application can be used for dynamic circuits as well.

Since many entries can be dotted to the same nodes, WBL and WBL_B, similar parasitic bipolar current concerns arises during the first cycle operation if most of the entries in the dotted net are the same content polarity. The dual rail write control input, WWL, is a gated C1 phase clock in the register cell 600 where the clock falling edge is the same timing edge as a regular ungated C1 phase clock. In the event of initial-cycle concerns, a secure write operation can be guaranteed by delaying the falling edge, that is having a gated C1 clock buffer, with overlap capability, conditionally triggered by the charge monitor circuit 100. In a write-through or write only operation, the completion of write is also given leniency because the rest of the path in the same cycle is primarily static gate/wire delay with the C2 scan cell latch operating in the transparent mode, that is, cycle stealing is allowed.

While the present invention has been described with reference to the details of the embodiments of the invention shown in the drawing, these details are not intended to limit the scope of the invention as claimed in the appended claims.

What is claimed is:

1. Apparatus to ensure functionality and timing robustness in a silicon-on-insulator (SOI) complementary metal oxide semiconductor (CMOS) circuit comprising:

a select signal for the SOI CMOS circuit;

a floating body charge monitoring circuit coupled to the SOI CMOS circuit for monitoring excess body charges in at least one predefined SOI device and providing an output control signal;

a select signal adjusting circuit receiving said select signal and coupled to said floating body charge monitoring circuit receiving said output control signal and providing a conditionally adjusted select signal responsive to said output control signal of said floating body charge monitor circuit; said conditionally adjusted select signal applied to the SOI CMOS circuit.

2. Apparatus to ensure functionality and timing robustness in a silicon-on-insulator (SOI) complementary metal oxide semiconductor (CMOS) circuit as recited in claim 1 wherein said conditionally adjusted select signal provided by said select signal adjusting circuit responsive to said output control signal of said floating body charge monitor circuit includes a predefined delay at the trailing edge of the select signal extending the select signal pulse width.

3. Apparatus to ensure functionality and timing robustness in a silicon-on-insulator (SOI) complementary metal oxide semiconductor (CMOS) circuit as recited in claim 1 wherein said conditionally adjusted select signal provided by said select signal adjusting circuit responsive to said output control signal of said floating body charge monitor circuit includes a shortened select signal pulse having a predefined delay at the rising edge of the select signal.

4. Apparatus to ensure functionality and timing robustness in a silicon-on-insulator (SOI) complementary metal oxide semiconductor (CMOS) circuit as recited in claim 1 wherein said conditionally adjusted select signal provided by said select signal adjusting circuit responsive to said output control signal of said floating body charge monitor circuit includes a substantially unchanged select signal pulse width with a predefined delay of the rising edge of the select signal.

5. Apparatus to ensure functionality and timing robustness in a silicon-on-insulator (SOI) complementary metal oxide semiconductor (CMOS) circuit as recited in claim 1 wherein said select signal adjusting circuit includes a plurality of inverter stages and wherein said conditionally adjusted select signal provided by said select signal adjusting circuit responsive to said output control signal of said floating body charge monitor circuit includes a predefined delay defined by said plurality of inverter stages.

6. Apparatus to ensure functionality and timing robustness in a silicon-on-insulator (SOI) complementary metal oxide semiconductor (CMOS) circuit as recited in claim 1 wherein said floating body charge monitoring circuit includes a monitor core circuit, a current mirroring multiplier and a latch providing said output control signal.

7. Apparatus to ensure functionality and timing robustness in a silicon-on-insulator (SOI) complementary metal oxide semiconductor (CMOS) circuit as recited in claim 1 wherein said floating body charge monitoring circuit detects excess body charges in said predefined SOI devices resulting from transient parasitic bipolar current and provides said output control signal to set said select signal adjusting circuit to provide said conditionally adjusted select signal.

8. Apparatus to ensure functionality and timing robustness in a silicon-on-insulator (SOI) complementary metal oxide semiconductor (CMOS) circuit as recited in claim 1 wherein said select signal adjusting circuit includes a first two-input NAND gate receiving said select signal and said output control signal; a plurality of series connected inverter stages connected to said first two-input NAND gate; an inverter receiving said select signal; a second two-input NAND gate receiving respective outputs of said series connected inverter stages and said inverter; said second two-input NAND gate providing said conditionally adjusted select signal output having an extension of a trailing edge of said select signal when triggered by said output control signal of said floating body charge monitor circuit.

9. Apparatus to ensure functionality and timing robustness in a silicon-on-insulator (SOI) complementary metal oxide semiconductor (CMOS) circuit as recited in claim 8 wherein said plurality of series connected inverter stages connected to said first two-input NAND gate provide an even number of inversions.

10. Apparatus to ensure functionality and timing robustness in a silicon-on-insulator (SOI) complementary metal oxide semiconductor (CMOS) circuit as recited in claim 1 wherein said select signal adjusting circuit includes a first two-input NAND gate receiving said select signal and said output control signal; a plurality of series connected inverter stages connected to said first two-input NAND gate; a first inverter receiving said select signal; a second two-input NAND gate receiving respective outputs of said series connected inverter stages and said first inverter; a second inverter connected to said second two-input NAND gate; said second inverter providing said conditionally adjusted select signal output having a delayed rising edge of said select signal when triggered by said output control signal of said floating body charge monitor circuit.

11. Apparatus to ensure functionality and timing robustness in a silicon-on-insulator (SOI) complementary metal oxide semiconductor (CMOS) circuit as recited in claim 10 wherein said plurality of series connected inverter stages connected to said first two-input NAND gate provide an even number of inversions.

12. Apparatus to ensure functionality and timing robustness in a silicon-on-insulator (SOI) complementary metal oxide semiconductor (CMOS) circuit as recited in claim 1 wherein said select signal adjusting circuit includes a plurality of inverters and a pair of tri-state inverters; said tri-state inverters having a control input; a first inverter receiving said select signal; a plurality of series connected inverter stages connected to said first inverter; a first one of said pair of tri-state inverters connected to said first inverter; a second one of said pair of tri-state inverters connected to said plurality of series connected inverter stages; said output control signal applied to said control input of said first one of said pair of tri-state inverters; and said output control signal being inverted applied to said control input of said second one of said pair of tri-state inverters; said pair of tri-state inverters providing said conditionally adjusted select signal output having a substantially unchanged pulse width and a delayed rising edge of said select signal when triggered by said output control signal of said floating body charge monitor circuit.

13. Apparatus to ensure functionality and timing robustness in a silicon-on-insulator (SOI) complementary metal oxide semiconductor (CMOS) circuit as recited in claim 12 wherein said first one and said second one of said pair of tri-state inverters are respectively set to a high-impedance state and an inversion state responsive to said output control signal.

14. A method to ensure functionality and timing robustness in a silicon-on-insulator (SOI) complementary metal oxide semiconductor (CMOS) circuit utilizing a charge monitoring circuit coupled to the SOI CMOS circuit and a select signal adjusting circuit comprising the steps of:
   utilizing said charge monitoring circuit coupled to the SOI CMOS circuit, monitoring excess body charges in at least one predefined SOI device and providing an output control signal;
   applying a select signal for the SOI CMOS circuit and said output control signal to said select signal adjusting circuit;
   utilizing said select signal adjusting circuit, providing a conditionally adjusted select signal responsive to said output control signal of said floating body charge monitor circuit; and
   applying said conditionally adjusted select signal to the SOI CMOS circuit.

15. A method to ensure functionality and timing robustness in a silicon-on-insulator (SOI) complementary metal oxide semiconductor (CMOS) circuit as recited in claim 14 wherein the step of utilizing said select signal adjusting circuit, providing a conditionally adjusted select signal responsive to said output control signal of said floating body charge monitor circuit includes the step of: providing said conditionally adjusted select signal with a predefined delay at the trailing edge of said select signal for extending a select signal pulse width.

16. A method to ensure functionality and timing robustness in a silicon-on-insulator (SOI) complementary metal oxide semiconductor (CMOS) circuit as recited in claim 14 wherein the step of utilizing said select signal adjusting circuit, providing a conditionally adjusted select signal responsive to said output control signal of said floating body charge monitor circuit includes the step of: providing said conditionally adjusted select signal output having a delayed rising edge of said select signal when triggered by said output control signal of said floating body charge monitor circuit.

17. A method to ensure functionality and timing robustness in a silicon-on-insulator (SOI) complementary metal oxide semiconductor (CMOS) circuit as recited in claim 14 wherein the step of utilizing said select signal adjusting circuit, providing a conditionally adjusted select signal responsive to said output control signal of said floating body charge monitor circuit includes the steps of: providing said conditionally adjusted select signal output having a substantially unchanged pulse width and a delayed rising edge of said select signal when triggered by said output control signal of said floating body charge monitor circuit.

\* \* \* \* \*